US011477911B1

(12) United States Patent
He

(10) Patent No.: US 11,477,911 B1
(45) Date of Patent: Oct. 18, 2022

(54) HEAT PIPE TAPERED DOWN IN FIN STACK REGION AND OPPOSITELY TAPERED FIN STACK

(71) Applicant: Dell Products L.P., Round Rock, TX (US)

(72) Inventor: Qinghong He, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/324,342

(22) Filed: May 19, 2021

(51) Int. Cl.
*H05K 7/20* (2006.01)
*G06F 1/20* (2006.01)
*H01L 23/427* (2006.01)

(52) U.S. Cl.
CPC ......... H05K 7/20154 (2013.01); G06F 1/206 (2013.01); H05K 7/20336 (2013.01); H01L 23/4275 (2013.01)

(58) Field of Classification Search
CPC .. F28D 15/02; F28D 15/04; F28D 2015/0216; F28D 15/0266; F28D 2021/0028; F28D 2021/0029; H01L 23/427; H01L 23/4275; H05K 7/20154; H05K 7/20336; G06F 1/206; F28F 13/08; F28F 3/02; F28F 2215/10; F28F 3/048; F28F 2215/06; F28F 1/02; F28F 2215/04
See application file for complete search history.

(56) References Cited

U.S. PATENT DOCUMENTS

| | | | | | |
|---|---|---|---|---|---|
| 3,537,514 | A | * | 11/1970 | Levedahl | F28F 1/40 141/31 |
| 3,786,861 | A | * | 1/1974 | Eggers | F28D 15/046 165/104.26 |
| 3,842,596 | A | * | 10/1974 | Gray | H02K 9/225 165/104.25 |
| 3,955,619 | A | * | 5/1976 | Corman | F28D 15/046 165/110 |
| 4,058,160 | A | * | 11/1977 | Corman | F28D 15/046 165/104.26 |
| 4,262,483 | A | * | 4/1981 | DeGeus | F24S 10/95 60/671 |
| 6,305,595 | B1 | * | 10/2001 | Chen | B23K 11/0046 228/183 |
| 6,550,531 | B1 | * | 4/2003 | Searls | F28F 3/022 165/104.33 |

(Continued)

OTHER PUBLICATIONS

Muhammad et al., Passive Power Generation and Heat Recovery from Waste Heat, Mar. 2015, Research Gate (Year: 2015).*

*Primary Examiner* — Michael A Matey
(74) *Attorney, Agent, or Firm* — Baker Botts, L.L.P.

(57) ABSTRACT

A thermal module with a heat pipe configured on a first portion having a constant cross-section thickness and a tapered second end configured for contact with a fin stack. The heat pipe is tapered along a length of the second portion such that the cross-section thickness of the heat pipe decreases toward the end of the heat pipe. A fin stack coupled to the tapered portion comprises a plurality of fins of different heights, wherein the fin heights increase such that the combined fin height and heat pipe cross-section thickness remains approximately constant over the width of the fin stack. The tapered heat pipe and fin stack with fins with increasing fin heights provide increased cooling and decreased airflow impedance through the fin stack.

14 Claims, 6 Drawing Sheets

(56) References Cited

U.S. PATENT DOCUMENTS

| | | | | |
|---|---|---|---|---|
| 7,258,160 | B2 * | 8/2007 | Hashimoto | G06F 1/203 |
| | | | | 165/905 |
| 7,738,248 | B2 * | 6/2010 | Tomioka | G06F 1/203 |
| | | | | 361/679.52 |
| 9,746,248 | B2 * | 8/2017 | Semenov | F28F 1/24 |
| 10,451,356 | B2 * | 10/2019 | Stellman | B22C 9/043 |
| 2006/0250776 | A1 * | 11/2006 | Abul-Haj | F28F 3/02 |
| | | | | 257/E23.099 |
| 2007/0029071 | A1 * | 2/2007 | Hwang | F28D 15/0275 |
| | | | | 257/E23.099 |
| 2007/0295485 | A1 * | 12/2007 | Liu | F28D 15/046 |
| | | | | 165/104.33 |
| 2008/0017356 | A1 * | 1/2008 | Gruss | H01L 35/30 |
| | | | | 29/890.032 |
| 2008/0105406 | A1 * | 5/2008 | Chang | B23P 15/26 |
| | | | | 165/146 |
| 2009/0308576 | A1 * | 12/2009 | Wang | B23P 15/26 |
| | | | | 29/890.032 |
| 2010/0155032 | A1 * | 6/2010 | Wu | F28D 15/046 |
| | | | | 29/890.032 |
| 2012/0160456 | A1 * | 6/2012 | Aoki | H01L 23/427 |
| | | | | 165/104.26 |
| 2014/0306450 | A1 * | 10/2014 | Satoh | F03D 80/00 |
| | | | | 290/2 |
| 2021/0215439 | A1 * | 7/2021 | Roy | H02K 9/225 |

\* cited by examiner

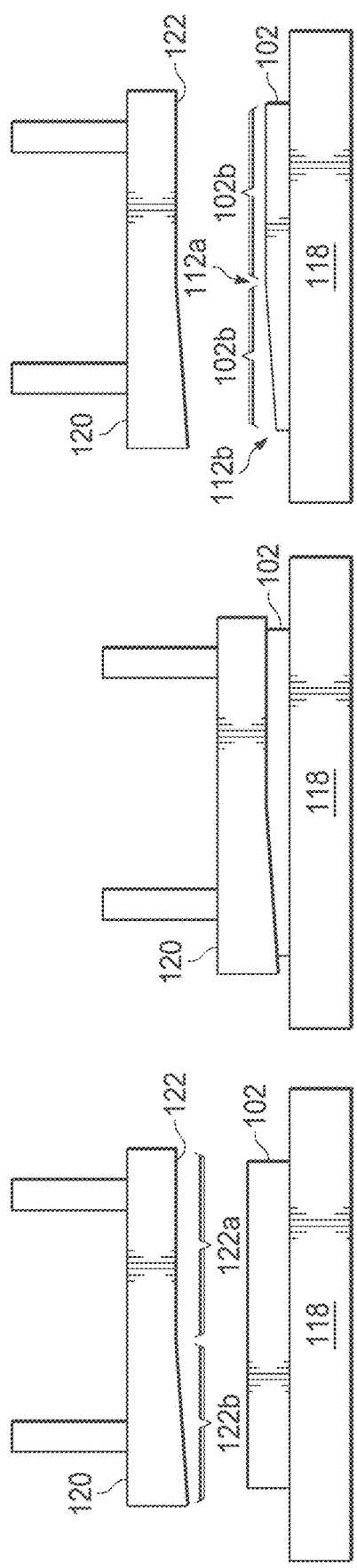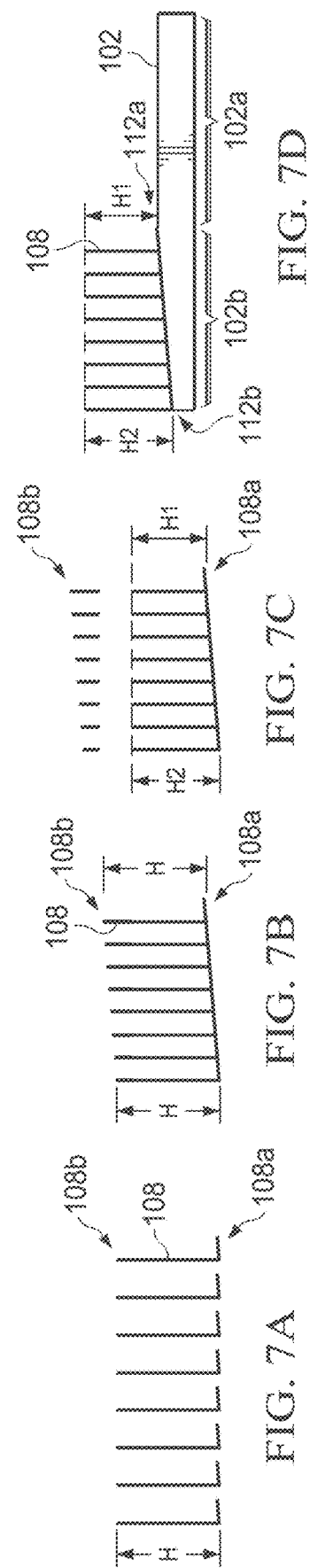

HEAT PIPE TAPERED DOWN IN FIN STACK REGION AND OPPOSITELY TAPERED FIN STACK

BACKGROUND

Field of the Disclosure

This disclosure relates generally to information handling systems and, more particularly, to thermal modules with heat pipes and fin stacks configured for increased cooling.

Description of the Related Art

As the value and use of information continues to increase, individuals and businesses seek additional ways to process and store information. One option available to users is information handling systems. An information handling system generally processes, compiles, stores, and communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

A heat pipe comprises a sealed hollow tube formed from a material selected for high heat conduction and contains a two-phase fluid and a wicking material. A first end of the heat pipe is positioned near a set of components, wherein heat is transferred from the set of components through the heat conducting material to the two-phase fluid. Heat applied to the two-phase fluid causes the fluid to transition from a liquid to a vapor, wherein the vapor travels axially (along the hollow tube) toward a second end positioned near a heat sink. When the vapor condenses, the wicking material transports the liquid back to the first end, where the cycle repeats. The material used to form the hollow tube, the dimension of the hollow tube, the two-phase fluid, the wicking material, and the heat sink are selected to maximize the heat transfer capabilities of the heat pipe.

SUMMARY

Embodiments disclosed herein may be directed to a thermal module with a heat pipe with a tapered section in contact with a plurality of fins of increasing height in a fin stack.

In one aspect, a thermal module for use in a chassis for an information handling system comprises a fan for generating an airflow out a fan outlet in the direction of a vent, a heat pipe comprising a first end configured for receiving heat from a set of components and a tapered second end, wherein a cross-section thickness of the tapered second end decreases from a first heat pipe cross-section thickness to a second heat pipe cross-section thickness along a length of the heat pipe, and a fin stack comprising a plurality of fins distributed over a width of the fin stack. Each fin has an edge configured for contact with the tapered second end of the heat pipe and has a fin height based on the position of the fin relative to the width of the fin stack. A combined heat pipe cross-section thickness and fin height is approximately constant over the width of the fin stack.

A width of the fin stack may be substantially equal to the tapered second end of the heat pipe. A fin height may be based on the position of the fin relative to the width of the fin stack. The combined heat pipe cross-section thickness and a fin height may be equal to a height of the fin stack. The fan outlet may have a constant height and the combined heat pipe cross-section thickness and fin height may be approximately equal to the height of the fan outlet. The fan outlet may have a variable height to accommodate design and space limitations and the combined heat pipe cross-section thickness and fin height may be approximately equal to the height of a fan outlet having a variable fan outlet height.

In one aspect, a method of manufacturing a thermal module for use in a chassis for an information handling system comprises forming a heat pipe with a first end configured for receiving heat from a set of components and a second end having a tapered height and forming a fin stack comprising a plurality of fins with a first end configured for contact with the second end of the heat pipe and configuring a plurality of fins distributed over a width of the fin stack such that a combined fin height and a heat pipe cross-section thickness is constant for the plurality of fins. A cross-section thickness of the second end decreases from a first heat pipe cross-section thickness to a second heat pipe cross-section thickness along a length of the heat pipe. In some embodiments, forming the heat pipe comprises compressing the second end of the heat pipe. In some embodiments, forming the fin stack comprises forming each fin with a first end having an angle complementary to the tapered second end of the heat pipe; coupling the first end of each fin to the first end of an adjacent fin; and cutting the second end of the plurality of fins such that the combined fin height and the heat pipe cross-section thickness is approximately constant over the width of the fin stack.

In one aspect, a chassis comprises a set of components, a heat pipe and a fin stack coupled to the heat pipe, wherein a first end of the heat pipe is configured for receiving heat from a set of components and a second end of the heat pipe is tapered, wherein a cross-section thickness of the tapered second end decreases from a first height to a second height along a length of the heat pipe, and a fin stack comprising a plurality of fins distributed over a width of the fin stack, wherein each fin has an edge configured for contact with the tapered second end of the heat pipe, each fin has a fin height based on the position of the fin relative to the width of the fin stack, and a combined heat pipe cross-section thickness and fin height is approximately constant over the width of the fin stack. A fan generates an airflow out a fan outlet in the direction of a vent, wherein the fin stack is positioned between the fan outlet and the vent.

In some embodiments, the width of the fin stack is substantially equal to the tapered second end of the heat pipe. In some embodiments, the fin height is based on the position of the fin relative to the width of the fin stack. In some embodiments, the combined heat pipe cross-section thickness and fin height is equal to a height of the fin stack.

In some embodiments, the combined heat pipe cross-section thickness and fin height is equal to a height of the fan outlet.

BRIEF DESCRIPTION OF THE DRAWINGS

For a more complete understanding of the present invention and its features and advantages, reference is now made to the following description, taken in conjunction with the accompanying drawings, in which:

FIGS. 6A-6C depict steps in a process for forming a heat pipe with a tapered end for use in a thermal module according to one embodiment;

FIGS. 7A-7D depict steps in a process for forming a fin stack with a plurality of fins with varying fin heights and coupling to the heat pipe formed in FIGS. 6A-6C for use in a thermal module according to one embodiment.

DESCRIPTION OF PARTICULAR EMBODIMENT(S)

Figure 1:
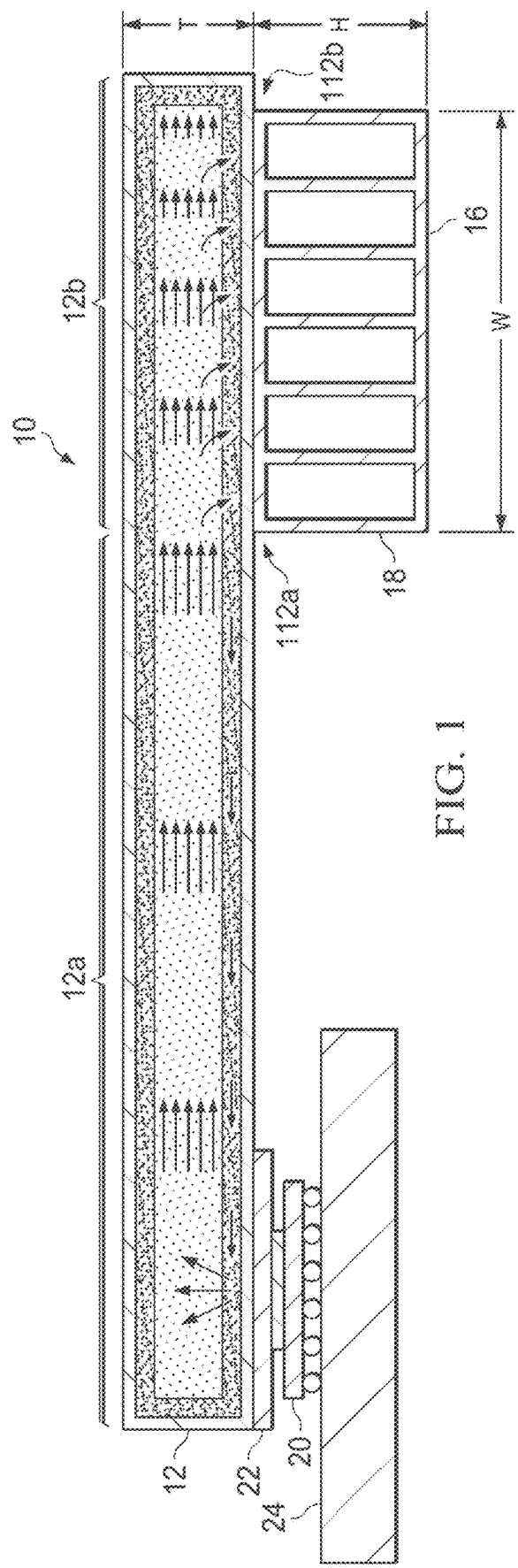
FIG. 1 depicts a cutaway view of an example thermal module for an information handling system with a heat pipe with a tapered end coupled to a fin stack with a plurality of fins of decreasing fin height according to one embodiment.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes and contained in a chassis. For example, an information handling system may be a laptop computer, a consumer electronic device, a network storage device, or another suitable device contained in a chassis and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

Components of an information handling system may include, but are not limited to, components of a processor subsystem, which may comprise one or more processors, and a system bus that communicatively couples various system components to the processor subsystem including, for example, a memory subsystem, an I/O subsystem, a local storage resource and a network interface.

Components of a processor subsystem may comprise a system, device, or apparatus operable to interpret and execute program instructions and process data, and may include a microprocessor, microcontroller, digital signal processor (DSP), application specific integrated circuit (ASIC), or other digital or analog circuitry configured to interpret and execute program instructions and process data. In some embodiments, components of a processor subsystem may interpret and execute program instructions and process data stored locally. In the same or alternative embodiments, components of a processor subsystem may interpret and execute program instructions and process data stored remotely.

Components of a system bus may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

Components of a memory subsystem may comprise a system, device, or apparatus operable to retain and retrieve program instructions and data for a period of time (e.g., computer-readable media). Components of a memory subsystem may comprise random access memory (RAM), electrically erasable programmable read-only memory (EEPROM), a PCMCIA card, flash memory, magnetic storage, opto-magnetic storage or a suitable selection or array of volatile or non-volatile memory that retains data after power is removed.

In information handling systems, components of an I/O subsystem may comprise a system, device, or apparatus generally operable to receive and transmit data to, from or within the information handling system. Components of an I/O subsystem may represent, for example, a variety of communication interfaces, graphics interfaces for communicating with a display, video interfaces, user input interfaces, and peripheral interfaces. Components 20 of an I/O subsystem may include more, fewer, or different input/output devices or components.

Components of a local storage resource may comprise computer-readable media (e.g., hard disk drive, floppy disk drive, CD-ROM, and other types of rotating storage media, flash memory, EEPROM, or another type of solid-state storage media) and may be generally operable to store instructions and data. For the purposes of this disclosure, computer-readable media may include an instrumentality or aggregation of instrumentalities that may retain data and instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and flash memory, such as a solid-state drive (SSD) comprising solid-state flash memory; as well as communications media such as wires, optical fibers, microwaves, radio waves, and other electromagnetic or optical carriers; or any combination of the foregoing.

Components of a network interface may be a suitable system, apparatus, or device operable to serve as an interface between information handling system 100 and a network (not shown). Components of a network interface may enable information handling system 100 to communicate over a network using a suitable transmission protocol or standard. In some embodiments, components of a network interface may be communicatively coupled via a network to a network storage resource (not shown). A network coupled to components 20 of a network interface may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and messages (generally referred to as data). A network coupled to components of a network interface may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, Advanced Technology Attachment (ATA), Serial ATA (SATA), Advanced Technology Attachment Packet Interface (ATAPI), Serial Storage Architecture (SSA), Integrated Drive Electronics (IDE), or any combination thereof. A network coupled to components of a network interface or various components associated therewith may be implemented using hardware, software, or any combination thereof.

During operation of information handling systems, components generate heat in performing the processes or purposes as mentioned above and require cooling. One approach to cooling information handling systems comprises a fan for generating an airflow, a heat pipe having a first end for receiving heat and a second end coupled to a fin stack positioned near a fan outlet, wherein airflow generated by the fan passes over a plurality of fins in the fin stack and out an exit port or vent to the ambient environment.

Embodiments disclosed herein are generally directed to thermal modules comprising a fan for generating an airflow, a heat pipe having a first portion with a constant cross-section thickness and a tapered second portion coupled to a fin stack comprising a plurality of fins of increasing fin height, wherein the combined fin height and heat pipe cross-section thickness remains constant over the length of the second portion.

Particular embodiments may be best understood by reference to FIGS. 1-5, 6A-6C and 7A-7D, wherein like numbers are used to indicate like and corresponding parts.
Heat Pipes with Constant Cross-Section Thicknesses have Reduced Heat Transfer Capabilities For ease of understanding, FIG. 1 depicts a cutaway view of thermal module 10 with a common heat pipe 12 having a constant cross-section thickness (T) for both first portion 12a and second portion 12b. Heat pipe 12 provides heat transfer away from component 20 of information handling systems contained in a chassis (not shown). Heat pipe 12 is generally manufactured as a sealed hollow tube of constant thickness (T) and contains a two-phase fluid and a wicking material. A first portion 12a of heat pipe 12 may be thermally coupled to a component 20 from which heat is to be removed and a second portion 12b may be thermally coupled to fin stack 16 to which the heat is to be transferred. The process by which the heat is transferred through heat pipe 12 is through phase transformation of the fluid from a liquid to a vapor due to heat received from component 20 in first portion 12a and convective heat transfer through the hollow tube to fin stack 16. In second portion 12b, the fluid condenses at fin stack 16 and is transported back to first portion 12a via the wicking material. Component 20 may be a CPU or other processor on mainboard 24 and heat pipe 12 may be thermally coupled indirectly to component 20 through cold plate 22 including any adhesive or other intervening layers.

Figure 2:
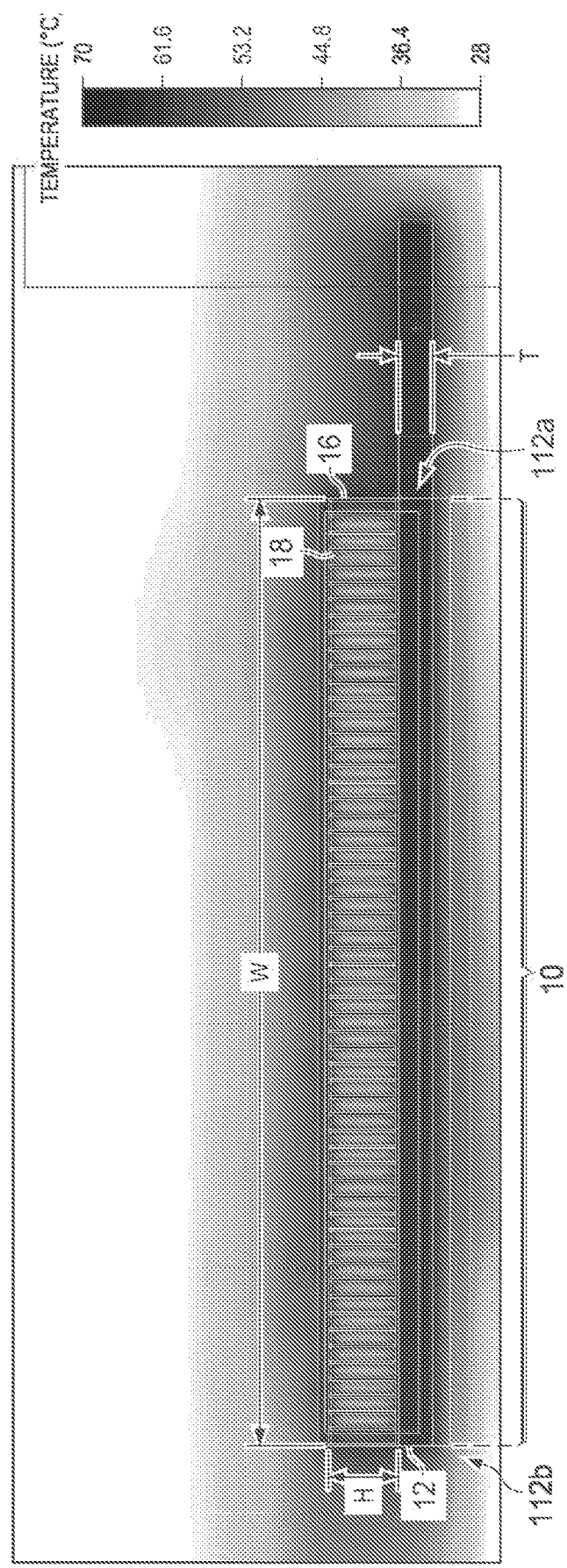
FIG. 2 depicts an image of a simulated temperature profile of a portion of one embodiment of a thermal module such as depicted in FIG. 1.

Referring to FIGS. 1 and 2, heat pipe 12 has a constant cross-section thickness (T) and fin stack 16 comprises a plurality of fins 18 distributed over a width (W) of fin stack 16, and all fins 18 have the same fin height (H). All fins 18 in fin stack 16 are capable of transferring the heat. However, as heat pipe 12 transfers heat past fin stack 16, the heat transferred to each fin 18 depends on the position of fin 18 relative to second end 112b. Accordingly, more heat is transferred to fins 18 near first end 112a and less heat is transferred to fins 18 positioned closer to the second end 112b of second portion 12b.

Referring to FIG. 2, a simulated temperature profile of a portion of common thermal module 10 having heat pipe 12 with second portion 12b having constant cross-section thickness (T) between first end 112a and second end 112b and fin stack 16 having a plurality of fins 18 with all fins 18 having the same fin height (H) over the width (W) of fin stack 16 indicates the design of thermal module 10 depicted in FIG. 1 may be ineffective at transferring heat. For example, the temperature profile depicts higher temperatures over the entire width (W) of the fin stack 16 and all fins 18 in fin stack 16. Fin stack 16 may be limited due to size constraints based on the layout or design of a chassis in which thermal module 10 is installed.
Heat Pipes with Tapered Cross-Section Thicknesses and Fin Stacks with Varying Fin Heights Referring to one or more of FIGS. 3-5, 6A-6C and 7A-7D, embodiments disclosed herein overcome these shortcomings with a thermal module 100 comprising heat pipe 102 having a first portion 102a with a substantially constant cross-section thickness (T) and a second portion 102b that is tapered from a first cross-section thickness (T1) to a second cross-section thickness (T2) less than the first cross-section thickness (T1). Embodiments further comprise fin stack 106 coupled to heat pipe 102, wherein fin stack 106 comprises a plurality of fins 108 of varying fin heights (H) such that each fin 108 has a fin height (H) based on the location of fin 108 in fin stack 106 and the combined fin height (H) and heat pipe cross-section thickness (T) is approximately constant over the width (W) of fin stack 106. In some embodiments, the combined fin height (H) ad heat pipe cross-section thickness (T) may vary to accommodate design and space limitations.

Figure 3:
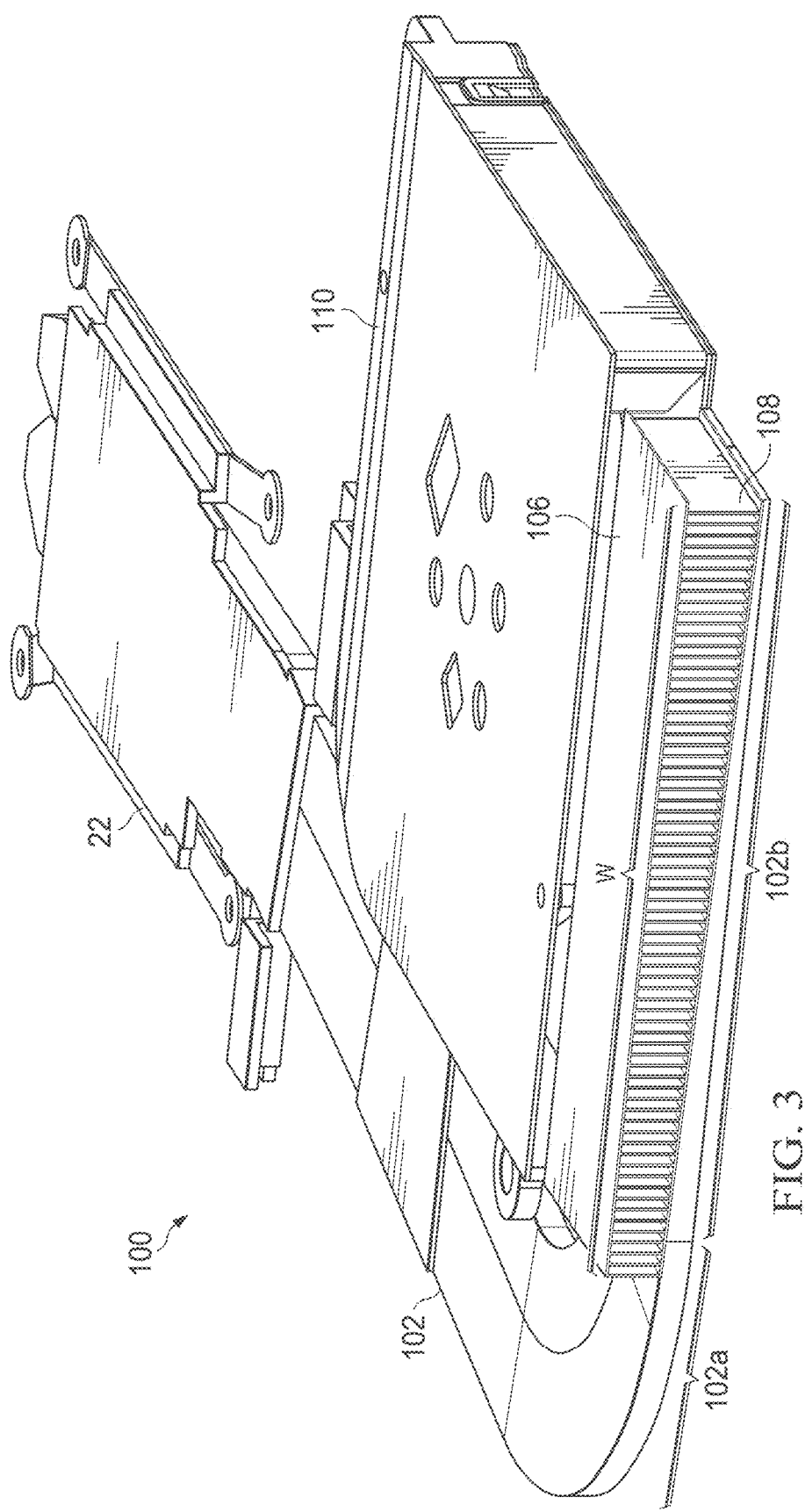
FIG. 3 depicts a perspective view of one embodiment of a thermal module with a tapered heat pipe coupled to an oppositely tapered fin stack positioned at a fan outlet.
Figure 4:
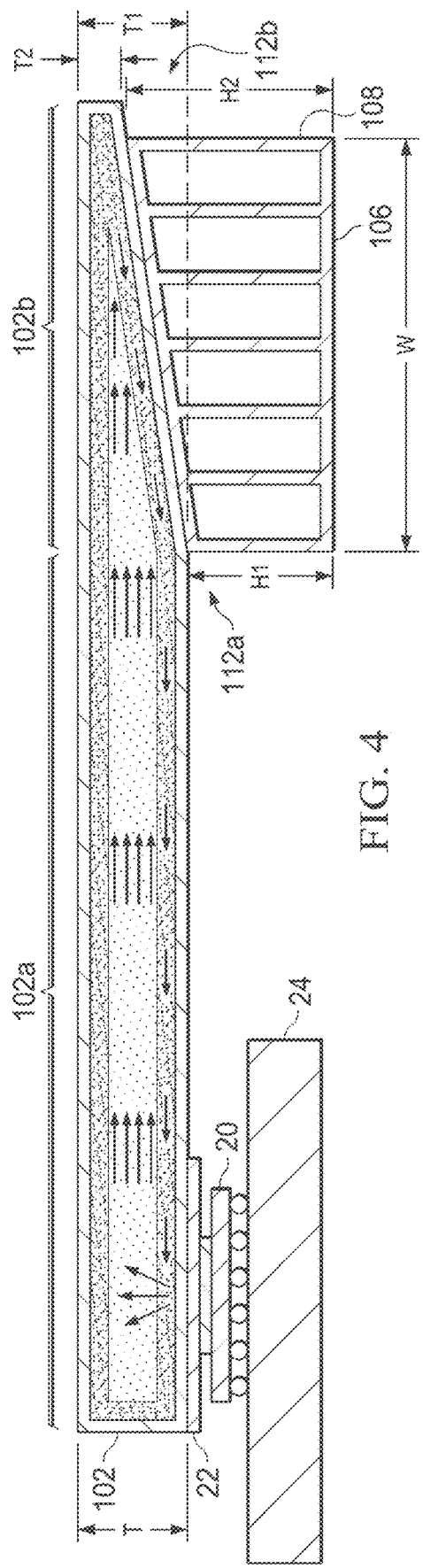
FIG. 4 depicts a cutaway view of an example thermal module for an information handling system with a heat pipe with a constant cross-section coupled to a fin stack with a plurality of fins of constant fin height.
Figure 5:
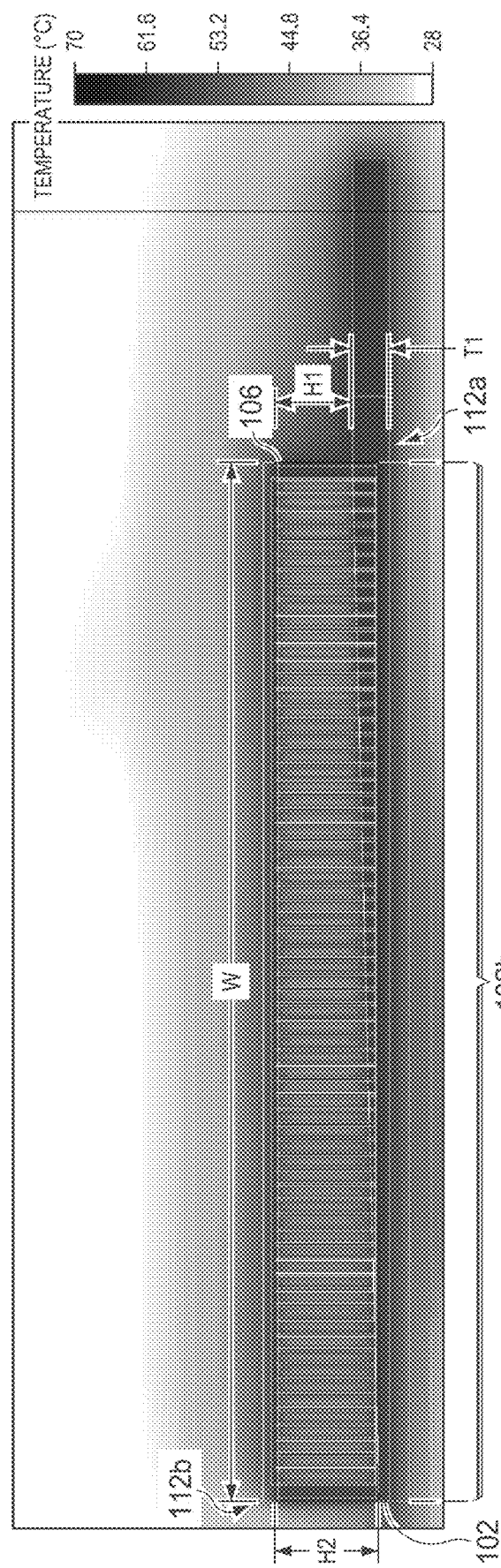
FIG. 5 depicts an image of a simulated temperature profile of a portion of a thermal module such as depicted in FIG. 4.

Referring to FIGS. 3-5, embodiments disclosed herein include thermal module 100 for cooling components in a chassis (not shown) with heat pipe 102 having first portion 102a thermally coupled to a component (not shown) or cold plate 22 coupled to the component and second portion 102b with a tapered cross-section thickness, wherein second portion 102b is thermally coupled to fin stack 106 having a plurality of fins 108 of varying fin height. Fin stack 106 and second portion 102b coupled to fin stack 106 may be positioned proximate an outlet of fan 110 operable for generating airflow thorough fin stack 106. Thermal module 100 may be positioned in a chassis (not shown) of an information handling system to cool components and the chassis.

Tapered Heat Pipe

Heat pipe 102 comprises first portion 102a configured for receiving heat from a component 20 or cold plate 22 coupled to component 20 and second portion 102b configured for contact with fin stack 106 comprising a plurality of fins 108 distributed over a width (W) of fin stack 106.

Heat pipe 102 comprises second portion 102b coupled to fin stack 106, wherein second portion 102b is tapered such that a heat pipe cross-section thickness (T) of heat pipe 102 decreases from a first heat pipe cross-section thickness (T1) to a second heat pipe cross-section thickness (T2) less than the first heat pipe cross-section thickness (T1). Second portion 102b having a tapered cross-section thickness (T) reduces the inner cross-section area of heat pipe 102, but fluid vapor continues to transfer heat along second portion 102b.

Fin Stack has Fins of Varying Fin Heights

Fin stack 106 has a width (W) between first end 112a and second end 112b of fin stack 106 and comprises a plurality of fins 108 distributed over the width (W). In some embodiments, the width (W) of fin stack 106 is equal to the length of second portion 102b of heat pipe 102. Fins 108 located near first end 112a of second portion 102b have a first fin height (H1) capable of transferring a first amount of heat and fins 108 located near second end 112b of second portion 102b have a second fin height (H2) capable of transferring a second amount of heat.

The fin heights (H) for the plurality of fins 108 may vary based on the position of each fin 108 in fin stack 106 and the cross-section thickness (T) of heat pipe 102 at the position of the fin 108, wherein each fin 108 has a fin height (H) that depends on its position in fin stack 106. Thus, fin 108 positioned near first end 112a of fin stack 106 has a first fin height (H1) and fin 108 positioned near second end 112b of fin stack 106 has a second fin height (H2) that is greater than the first fin height (H1).

Heat Pipe Cross-Section Thickness and Varying Fin Heights are Complementary

Even though the heat pipe cross-section thickness (T) decreases over the length of second portion 102b, the fin heights (H) of fins 108 increase over the width (W) of fin stack 106 such that the combined fin height (H) and heat pipe cross-section thickness (T) for each fin 108 remains constant over the width of fin stack 106. For example, the combined fin height (H1) corresponding to fin 108 located at first end 112a of fin stack 106 and heat pipe cross-section thickness (T1) corresponding to first end 112a of second portion 102b of heat pipe 102 is equal to the combined fin height (H2) corresponding to fin 108 located at second end 112b of fin stack 106 and heat pipe cross-section thickness (T2) corresponding to second end 112b of second portion 102b of heat pipe 102. The dimensions of second portion 102b of heat pipe 102 and fins 108 of fin stack 106 may correspond to the dimensions of a fan outlet (not shown). For example, the length of second portion 102b of heat pipe 102 may correspond to a length of a fan outlet of fan 110 and the combined fin height (H) and heat pipe cross-section thickness (T) may correspond to a height of a fan outlet of fan 110. In some chassis, the height of a fan outlet may vary due to design and space limitations. Accordingly, in some embodiments, a combined fin height (H) and heat pipe cross-section thickness (T) may be approximately equal to a height of a fan outlet having a variable fan height.

Design Reduces Fan Impedance

Embodiments may result in an increase in total open space and fin surface area of fin stack 106. Table 1 depicts a parameters of a common thermal module 10 having heat pipe 10 with constant cross-section thickness and fin stack 16 having a plurality of fins 18 of constant fin height and also depicts parameters of thermal module 100 having a tapered heat pipe 102 and fin stack 106 having a plurality of fins 108 of varying fin heights.

TABLE 1

| Parameter | Thermal Module 10 with Constant Heat Pipe Thickness and Fin Height | Thermal Module 100 with Tapered Heat Pipe and Varying Fin Heights | Change |
| --- | --- | --- | --- |
| Fin stack width | 70 mm | 70 mm | No change |
| Fin depth | 20 mm | 20 mm | No change |
| Fin thickness | 0.2 mm | 0.2 mm | No change |
| Fin height average | 5 mm (constant) | 5.9 mm (varying from 5 mm to 6.8 mm) | 18% increase |
| Heat pipe cross-section thickness (T) | 2.5 mm (constant) | 1.6 mm average (tapering from 2.5 mm to 0.7 mm) | 0.9 mm decrease |
| Total open space for airflow | 292 mm^2 | 330 mm^2 | 13% increase |
| Total fin surface area | 11600 mm^2 | 16520 mm^2 | 42% increase |
| Heat pipe temperature | 64.4 C. | 59.7 C. | 4.7 C. decrease |
| R_th-hp-to-air | 1.21 C./Watt | 1.06 C./Watt | 12.4% decrease |

As depicted in Table 1, forming thermal module 100 with a tapered heat pipe 102 and fin stack 106 having fins 108 of varying fin heights may increase the average fin height by 18%. As a result, total open space for airflow may be increased by 13% which results in lower airflow impedance. Furthermore, forming thermal module 100 with a tapered heat pipe 102 and fin stack 106 having fins 108 with varying fin heights may increase the total fin surface area by 42%. Comparison of simulated temperature profiles of the two thermal modules 10 and 100 indicate thermal module 100 may allow increased airflow through fin stack 106 to decrease the temperature inside a chassis by 4.7 C.

Design Allows for Increase in Fin Count

Referring to FIGS. 3-5 and Table 1, embodiments may increase the total open space for airflow. In some embodiments, the number of fins 108 in fin stack 106 may be the same as the number of fins 18 in fin stack 16. However, the increased total open space reduces the airflow impedance. Accordingly, in some embodiments, the number of fins 118 in fin stack 106 may be more than the number of fins 18 in fin stack 16 but still have the same or lower airflow impedance. In some embodiments, fin stack 106 may be configured with 20% more fins 108 than fin stack 16 and still have the same airflow impedance. The increase in the number of fins 108 with the same airflow impedance allows thermal module 100 to provide more convective heat transfer to an airflow for increased cooling capacity.

Referring to FIG. 5, a simulated temperature profile of a portion of thermal module 100 having tapered heat pipe 102 and fin stack 106 having varying fin heights configured such that the combined fin height (H) and heat pipe cross-section thickness (T) is constant over the width (W) of fin stack 106 illustrates the design of thermal module 100 depicted in FIGS. 3 and 4 is capable of higher cooling performance.

As depicted in FIG. 5, fin stack 106 may comprise a plurality of fins 108 having varying fin heights. The temperature profile of thermal module 100 having heat pipe 102 with tapered second portion 102b and fin stack 106 having a plurality of fins 108 of increasing fin height (H) indicates the design of thermal module 100 depicted in FIGS. 3 and 4 is effective at transferring heat. For example, the temperature profile depicts lighter shading corresponding to lower temperatures at second end 112b of fin stack 106 and second portion 102b of heat pipe 102 and generally lower temperatures over the width (W) of second portion 102b of heat pipe 102 and all fins 108 in fin stack 106. Thus, thermal module 100 having heat pipe 102 with tapered second portion 102b and fin stack 106 having fins 108 of increasing fin height may transfer more heat from component 20 using the same fan 110 and airflow.

FIGS. 6A-6C depict steps in one method for manufacturing heat pipe 102 having first portion 102a configured with a constant cross-section thickness (T) and second portion 102b tapered from a first cross-section thickness (T1) to a second cross-section thickness (T2).

As depicted in FIG. 6A, heat pipe 102 may be formed with constant cross-section thickness (T) and positioned between first surface 118 and tool 120 having second surface 122.

As depicted in FIG. 6B, tool 120 may be lowered or moved closer to first surface 118 such that second surface 122 contacts heat pipe 102. Continued movement of tool 120 causes second surface 122 to deform heat pipe 102 based on the profile of second surface 122.

As depicted in FIG. 6C, tool 120 may be withdrawn from first surface 118 such that second surface 122 does not contact heat pipe 102 and heat pipe 102 is configured with second portion 102b tapered from a first cross-section thickness (T1) corresponding to first end 112a to second cross-section thickness (T2) corresponding to second end 112b.

FIGS. 7A-7D depict steps in one method for manufacturing fin stack 106 having fins 108 of varying fin heights (H) and coupling fin stack 106 to heat pipe 102 having a tapered cross-section thickness.

As depicted in FIG. 7A, a plurality of fins 108 may be formed with the same fin height (H) between a first end 108a and a second end 108b.

As depicted in FIG. 7B, first ends 108a of fins 108 may be coupled to form fin stack 106. At this stage, each fin 108 in fin stack 106 may have the same fin height (H) such that, if fin stack 106 is coupled to heat pipe 12 having a constant cross-section thickness (T), the combined height will increase.

As depicted in FIG. 7C, second ends 108b of fins 108 may be cut, wherein fin stack 106 comprises a plurality of fins 108 of varying fin heights from a first fin height (H1) to a second fin height (H2).

As depicted in FIG. 7D, fin stack 106 comprising a plurality of fins 108 of varying fin heights from a first fin height (H1) to a second fin height (H2) may be coupled to heat pipe 102 having a cross-section thickness that tapers from a first cross-section thickness (T1) near first end 112a to a second cross-section thickness (T2) near second end 112b, wherein the combined fin height (H) and cross-section thickness (T) remains constant over the width (W) of fin stack 106. Second ends 108b may be coupled to form a surface of fin stack 106.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A thermal module for use in a chassis for an information handling system, the thermal module comprising:
    a fan for generating an airflow out a fan outlet in the direction of a vent;
    a heat pipe comprising a first portion with a cross-section thickness configured for receiving heat from a set of components and a tapered second portion, wherein a cross-section thickness of the tapered second portion decreases from a first heat pipe cross-section thickness to a second heat pipe cross-section thickness along a length of the tapered second portion; and
    a fin stack comprising a plurality of fins distributed over a width of the fin stack, wherein
        each fin has a first end configured for contact with the tapered second portion of the heat pipe;
        each fin has a fin height based on the position of the fin relative to the width of the fin stack;
        a combined heat pipe cross-section thickness and fin height is approximately constant over the width of the fin stack, wherein the combined heat pipe cross-section thickness and fin height at each fin across the width of the fin stack is equal to a height of the fan outlet; and
        the tapered second portion of the heat pipe and the fin stack are positioned near the fan outlet.

2. The thermal module of claim 1, wherein the length of the tapered second portion of the heat pipe is substantially equal to the width of the fin stack.

3. The thermal module of claim 1, wherein the fin height is based on the position of the fin in the fin stack.

4. The thermal module of claim 1, wherein the fan outlet comprises a variable fan outlet height, wherein the combined heat pipe cross-section thickness and fin height at each fin across the width of the fin is equal to the variable fan outlet height.

5. The thermal module of claim 1, wherein the tapered second portion of the heat pipe and the fin stack are positioned between the fan outlet and the vent.

6. A method of manufacturing a thermal module for use in a chassis for an information handling system, the method comprising:
    forming a heat pipe with a first portion with a constant cross-section thickness and a second portion having a tapered cross-section, wherein a cross-section thickness of the second portion decreases from a first heat pipe cross-section thickness to a second heat pipe cross-section thickness along a length of the second portion; and
    forming a fin stack comprising:

forming a plurality of fins with a first end configured for contact with the second portion of the heat pipe;

distributing the plurality of fins over a width of the fin stack; and configuring the plurality of fins such that a combined fin height and heat pipe cross-section thickness is equal to a height of the fin stack over the width of the fin stack.

7. The method of claim 6, wherein forming the heat pipe comprises compressing the second portion of the heat pipe.

8. The method of claim 6, wherein forming the fin stack comprises:

forming each fin with a first end having an angle complementary to the tapered second portion of the heat pipe;

coupling the first end of each fin to the first end of an adjacent fin; and cutting a second end of the plurality of fins such that the combined fin height and heat pipe cross-section thickness is constant over the width of the fin stack.

9. A chassis comprising:

a set of components;

a heat pipe comprising a first portion configured for receiving heat from the set of components and a tapered second portion, wherein a cross-section thickness of the tapered second portion decreases from a first heat pipe cross-section thickness to a second heat pipe cross-section thickness along a length of the heat pipe; and a fin stack comprising a plurality of fins distributed over a width of the fin stack, wherein each fin has an edge configured for contact with the tapered second portion of the heat pipe;

each fin has a fin height based on the position of the fin relative to the width of the fin stack; and a combined heat pipe cross-section thickness and fin height is equal to a height of the fin stack over the width of the fin stack; and a fan for generating an airflow out a fan outlet in the direction of a vent, wherein the fin stack is positioned near the fan outlet.

10. The chassis of claim 9, wherein the width of the fin stack is substantially equal to the tapered second portion of the heat pipe.

11. The chassis of claim 9, wherein the fin height is based on the position of the fin relative to the width of the fin stack.

12. The chassis of claim 9, wherein the combined heat pipe cross-section thickness and fin height is equal to a height of the fan outlet.

13. The chassis of claim 9, wherein the fan outlet comprises a variable fan outlet height, wherein the combined heat pipe cross-section thickness and fin height at each fin across the width of the fin is equal to the variable fan outlet height.

14. The chassis of claim 9, wherein the tapered second portion of the heat pipe and the fin stack are positioned between the fan outlet and the vent.

* * * * *